United States Patent
Behzad et al.

(10) Patent No.: US 7,449,365 B2
(45) Date of Patent: Nov. 11, 2008

(54) WAFER-LEVEL FLIPCHIP PACKAGE WITH IC CIRCUIT ISOLATION

(75) Inventors: Arya Reza Behzad, Poway, CA (US); Matthew Vernon Kaufmann, Morgan Hill, CA (US); Malcolm MacIntosh, Escondido, CA (US); Jacob Jude Rael, Lake Forest, CA (US); Henry K. Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 239 days.

(21) Appl. No.: 11/375,433

(22) Filed: Mar. 14, 2006

(65) Prior Publication Data
US 2007/0139068 A1 Jun. 21, 2007

Related U.S. Application Data

(60) Provisional application No. 60/735,073, filed on Nov. 9, 2005.

(51) Int. Cl.
*H01L 21/00* (2006.01)
(52) U.S. Cl. ............... 438/108; 438/612; 257/E21.511
(58) Field of Classification Search ................. 438/106, 438/108, 612; 257/778, E21.503, E21.511
See application file for complete search history.

(56) References Cited

U.S. PATENT DOCUMENTS

| | | | |
|---|---|---|---|
| 5,534,465 A | * | 7/1996 | Frye et al. .................... 438/108 |
| 5,728,606 A | * | 3/1998 | Laine et al. .................. 438/122 |

* cited by examiner

*Primary Examiner*—Brook Kebede
(74) *Attorney, Agent, or Firm*—Garlick Harrison & Markison; Bruce E. Garlick

(57) ABSTRACT

Forming a wafer level chip scale flip chip package includes determining isolation requirements of an integrated circuit formed in a semi conductive substrate from package signal connections of the wafer level chip scale flip chip package. Operation may further include, based upon the integrated circuit characteristics, selecting a thickness of at least one dielectric layer isolating a top metal layer of the integrated circuit from the package signal connections of the wafer level chip scale flip chip package, determining a minimum pitch of the package signal connections of the wafer level chip scale flip chip package, and determining a maximum lateral distance from the signal pad to a servicing package signal connection of the wafer level chip scale flip chip package and determining a position of the servicing package signal connection of the wafer level chip scale flip chip package based upon the maximum lateral distance.

25 Claims, 10 Drawing Sheets

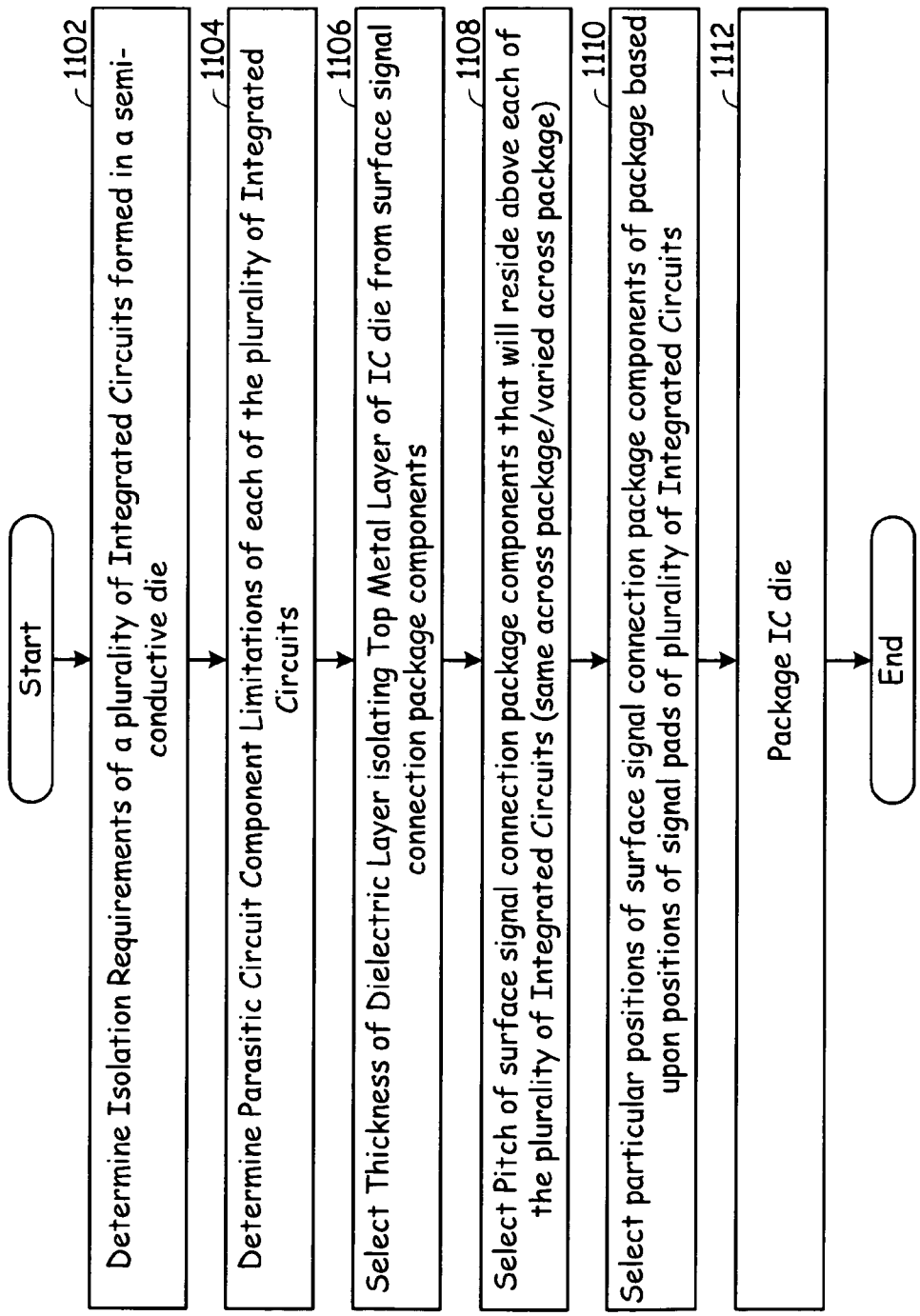

WAFER-LEVEL FLIPCHIP PACKAGE WITH IC CIRCUIT ISOLATION

CROSS REFERENCE TO RELATED APPLICATION

This application claims priority to U.S. Provisional Patent Application Ser. No. 60/735,073 filed Nov. 9, 2005, which is incorporated herein by reference for all purposes.

BACKGROUND OF THE INVENTION

1. Technical Field of the Invention

This invention relates generally to integrated circuit packaging and more particularly to wafer level packaging.

2. Description of Related Art

The manufacture, packaging, and use of integrated circuits is generally known. A manufacturing process within a fabricating facility is used to form a unit number of integrated circuits on a single semiconductive substrate. After formation, the semiconductive substrate is divided into the unit number of integrated circuits, i.e., dies. The dies are then packaged. The package provides protection for the integrated circuit die and provides electrical connections between the integrated circuits formed on the die and package pads. The packaged dies are then usually mounted upon printed circuit boards (PCBs) and installed into host devices. The PCBs include conductors that communicatively couple the circuits of the integrated circuit with circuits of other integrated circuits, with PCB connectors, and with user interface devices, etc.

As manufacturing process dimensions continue to decrease, larger numbers of circuits are formed on ever-smaller dies. In order to reduce the overall size of the PCBs upon which the packaged dies are mounted, packages having reduced dimensions have been developed. One type of integrated circuit package is referred to as a "wafer-level package". With a wafer-level package, the size of the package is substantially the same as the size of the die contained within. In one particular type of wafer-level package, package surface located package signal connections, e.g., bumps or balls, of the wafer-level package serve as the electrical interface between the electrical connections of the package and the PCB upon which it mounts. While such wafer-level packaging provides significant advantages with regard to size and power consumption, the package often fails to provide sufficient isolation to the circuitry contained on the die. Thus, a need exists for wafer-level packaging that satisfies the circuit requirements of the integrated circuits formed on the die.

BRIEF SUMMARY OF THE INVENTION

The present invention is directed to apparatus and methods of operation that are further described in the following Brief Description of the Drawings, the Detailed Description of the Drawings, and the Claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 11 is a flow chart illustrating a method for constructing a wafer-level chip scale flip chip package according to another embodiment of the present invention.

DETAILED DESCRIPTION OF THE INVENTION

Figure 1:
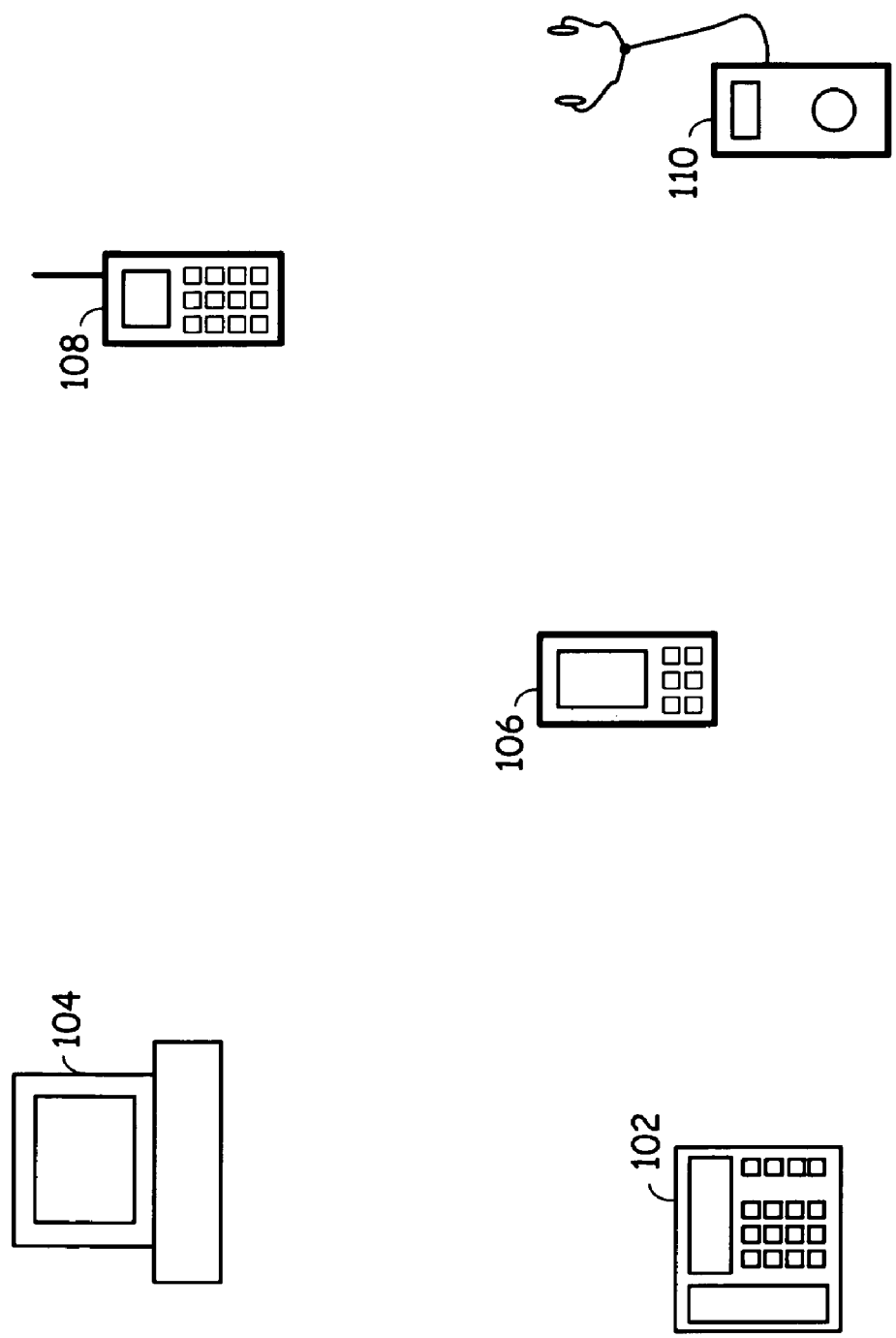
FIG. 1 is a diagram illustrating examples of devices that contain integrated circuits packaged according to the present invention.

FIG. 1 is a diagram illustrating examples of devices that contain integrated circuits packaged according to the present invention. A telephone 102, a computer 104, a Personal Data Assistant (PDA) 106, a wireless handset 108, and an MP3 player 110 each contain one or more Integrated Circuits (ICs) packaged according to the present invention. Some of these devices such as the PDA 106, the handset 108, and the MP3 player 110 may have severe space limitations that require a small foot print Printed Circuit Board (PCB) that hosts one or more packaged ICs. A wafer-level flip chip package formed according to the present invention is substantially the same size as the IC die it contains. Thus, a device containing a PCB upon which IC packages constructed according to the present invention mount may have a much reduced physical size.

Figure 2:
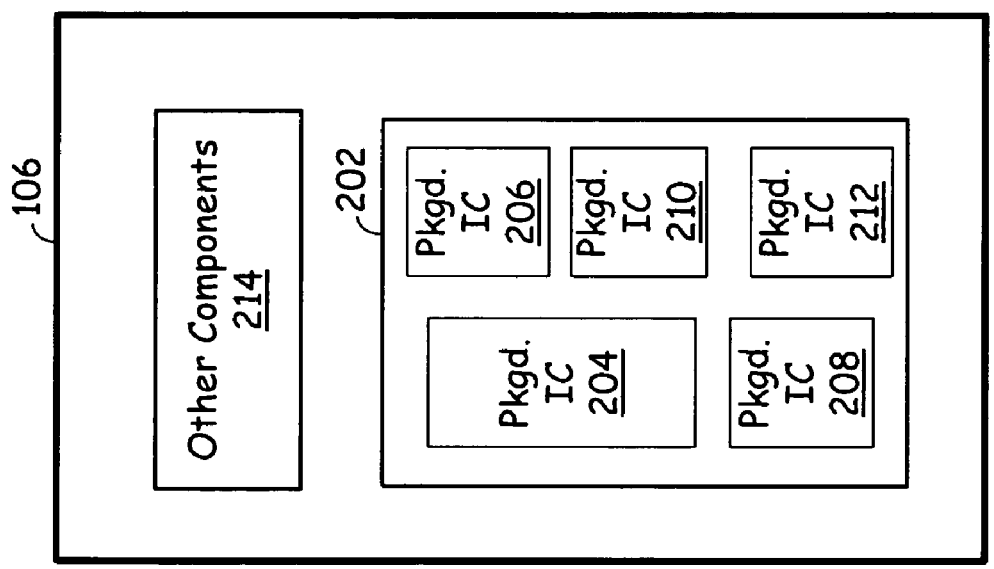
FIG. 2 is a block diagram illustrating a plurality of integrated circuit packages constructed according an embodiment of the present invention that are contained within the PDA of FIG. 1.

FIG. 2 is a block diagram illustrating a plurality of integrated circuit packages constructed according an embodiment of the present invention that are contained within the PDA of FIG. 1. The PDA 106 contains a printed circuit board (PCB) 202 upon which the plurality of IC packages mount. The PDA 106 also includes other components 214 such as a keypad interface, a display, a battery, and an audio interface. The other components 214 couple to PCB 202 via electrical connections.

The PCB 202 has mounted thereon a plurality of wafer-level flip chip IC packages constructed according to the present invention. Each of these IC packages 204-212 includes an IC die having circuitry contained thereon that performs particular respective processing functions for the PDA 106. The PCB 202 communicatively couples the plurality of packaged ICs 206-212 and provides a physical surface upon which they mount.

The embodiment of FIG. 2 illustrates one structure for forming a host device according to the present invention. In another structure, the PDA 106 may have a fewer number of packaged ICs or a greater number of packaged ICs. In another structure, the PDA 106 may have multiple PCBs and other components.

Referring to both FIGS. 1 and 2, the telephone 102, the computer 104, the handheld voice terminal 108, and the MP3 player 110 may have a structure similar to the structure of PDA 106. In such case, each of these devices would house ICs packaged according to the present invention. Some devices, such as voice terminal 108 include ICs that service a wireless interface between the voice terminal 108 and other devices using Radio Frequency (RF) communications. These RF ICs include inductive components formed in multiple metal layers of the IC. The IC packages that package these RF ICs (that include inductive components) may interfere with the operation of the inductive components of the IC. While packaging has some influence upon the operation of all ICs packaged therein, the IC package may a greater effect on the inductive elements of the RF ICs. Thus, according to the present invention, which will be described further with reference to FIGS. 3-11, an IC package meets the isolation requirement, parasitic circuit limitation requirements, and other circuit requirements of the ICs of the die contained by the IC package.

Figure 3:
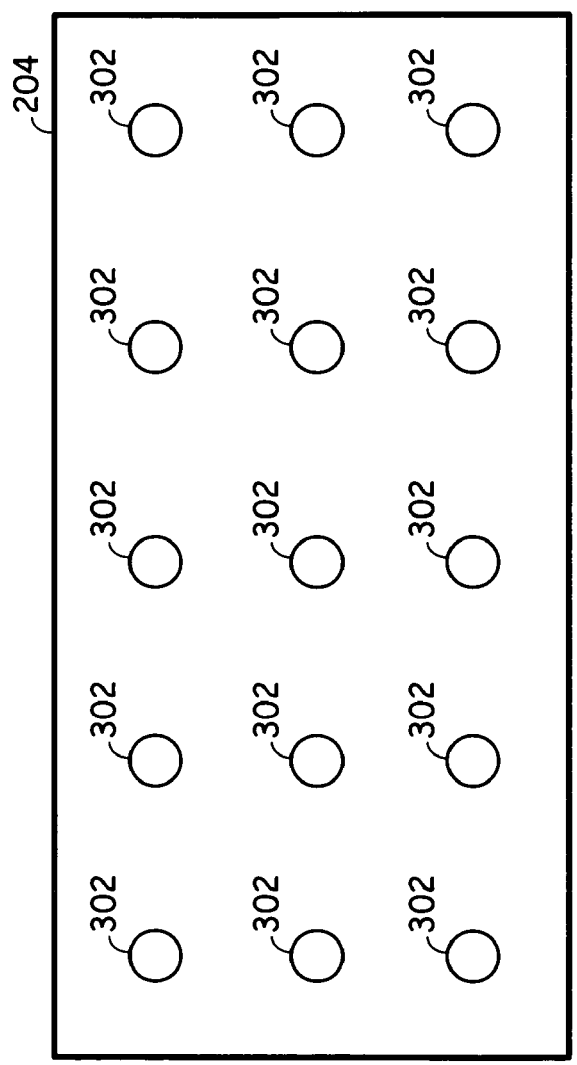
FIG. 3 is a diagrammatic bottom view of an integrated circuit package formed according to an embodiment of the present invention.

FIG. 3 is a diagrammatic bottom view of an integrated circuit package formed according to an embodiment of the present invention. This type of IC package 204 is referred to herein as a wafer-level flip chip package. The IC package 204 includes, among other structure, a plurality of package signal connections 302. The package signal connections 302 may be formed of metal, e.g., solder, that may be bonded to electrical connections of a PCB 202 upon which the packaged IC 204 mounts. With some embodiments of the present invention, the package signal connections are bumps or balls. With other embodiments, the package signal connections are metal columns, springs, or other contacts. These package signal connections 302 communicatively couple to the ICs of the packaged IC die via conductors formed in the IC package, pads formed on the IC die, and conductors formed within the IC die.

Figure 4:
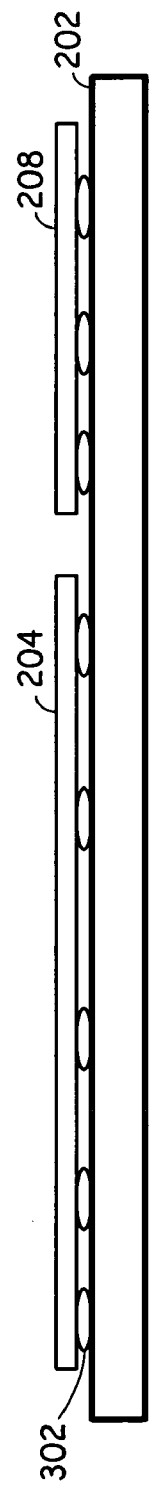
FIG. 4 is a diagrammatic side view of a Printed Circuit Board (PCB) upon which a plurality of integrated circuit packages formed according to an embodiment of the present invention mount.

FIG. 4 is a diagrammatic side view of a Printed Circuit Board (PCB) upon which a plurality of integrated circuit packages formed according to an embodiment of the present invention mount. With the embodiment of FIG. 4, the packaged IC 204 mounts upon PCB 202 by applying sufficient heat to melt the metal bumps/balls 302 such that they affix to conductive pads of the PCB 202. The PCB 202 includes, in addition to the pads to which the bumps/balls 302 affix, dielectric layers, conductors formed upon and between the dielectric layers, and vias that pass through the dielectric layers and couple to the conductors. The PCB 202, as was previously described, provides electrical connections between the packaged ICs 204 and 208, as well as between the packaged ICs 204 and 208 and connectors (not shown) mounted upon the PCB. The package signal connections could be affixed to the conductive pads of the PCB 202 using other techniques as well, such as adhesive techniques or thermo mechanical bonding, among other techniques.

Figure 5:
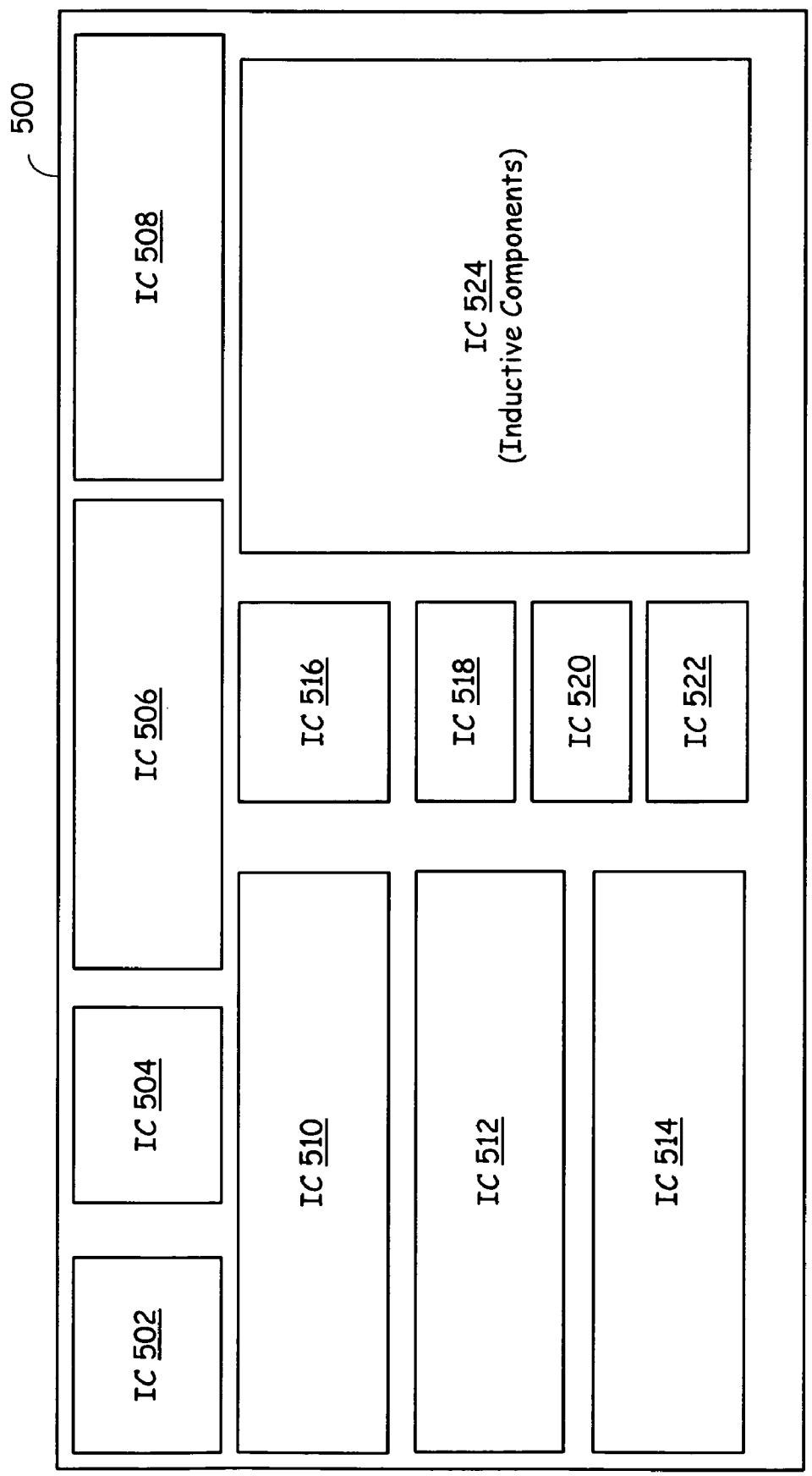
FIG. 5 is a block diagram illustrating an integrated circuit that may be packaged according to an embodiment the present invention.

FIG. 5 is a block diagram illustrating an integrated circuit that may be packaged according to the present invention. IC die 500 includes a plurality of ICs 502-524. As is generally known, an IC die 500 may have a plurality of ICs 502-524 formed thereon, each with unique operational characteristics/functions. IC 500 for example services RF communications with IC 524 including inductive components while other ICs of the IC die 500 not include inductive components. According to the present invention, the IC package packages the IC die 500 to meet the isolation requirements, parasitic circuit limitations, and other limitations of each of the ICs 502-524 formed on IC die 500. According to another aspect of the present invention, the IC package has respective differing structure that meets differing isolation requirements, different parasitic circuit limitations, and other circuit limitations of each of ICs 502-524.

Figure 6:
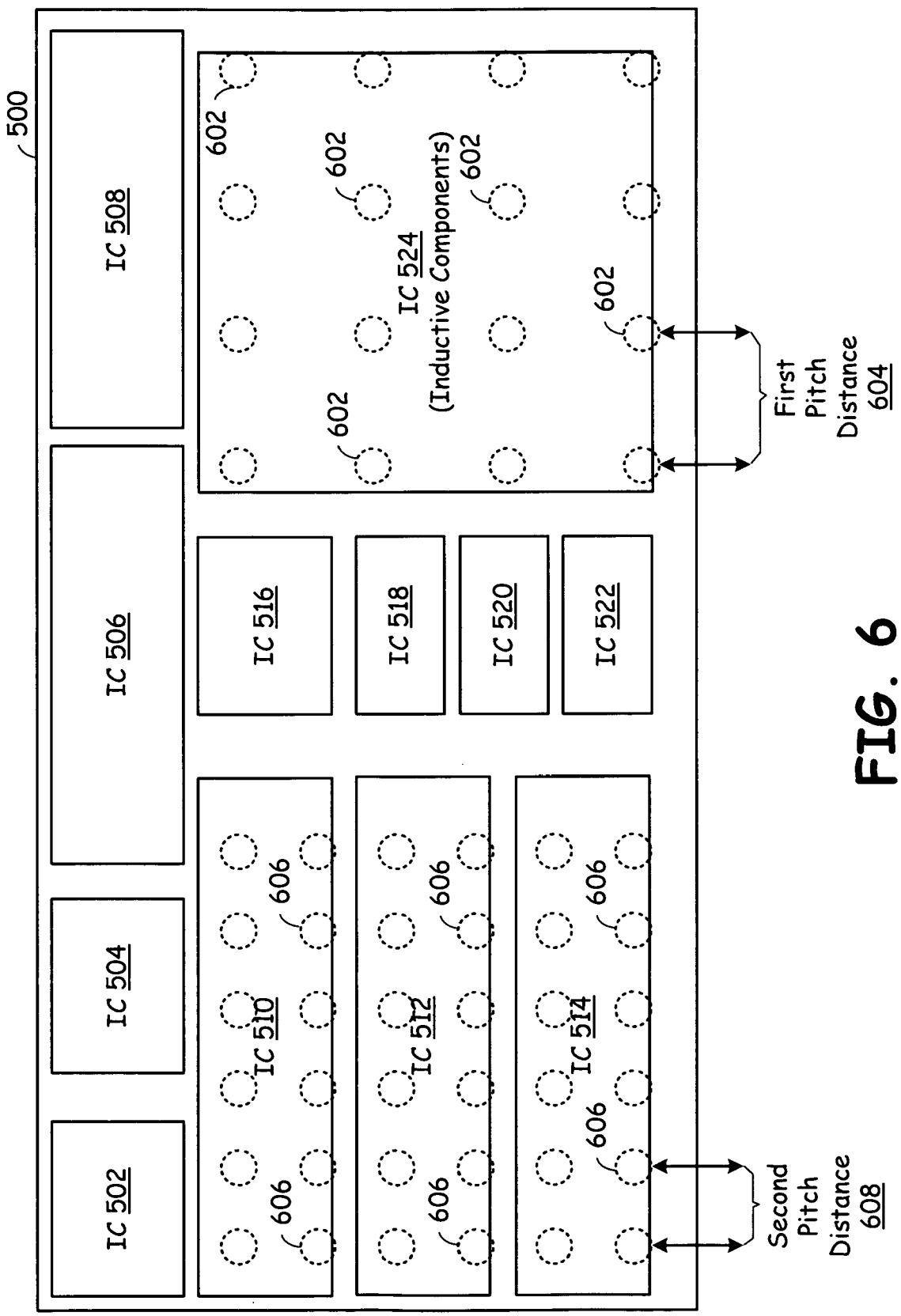
FIG. 6 is a diagrammatic transparent top view of a wafer-level flip chip package containing the integrated circuit of FIG. 5 and constructed according to an embodiment of the present invention.

FIG. 6 is a diagrammatic transparent top view of a wafer-level flip chip package constructed according to an embodiment of the present invention. The IC die 500 includes the plurality of ICs 502-524 and servicing package signal connections 602 and 606 of the IC package. The package signal connections 602 and 606 provide connectivity between PCB pads and pads of the IC die 500. According to one aspect to the present invention, a pitch distance between package signal connections of the IC package varies based upon the characteristics of underlying ICs. For example, IC 524 includes inductive components that require particular minimum isolation from package signal connections 602. Therefore, the package signal connections 602 that overlay IC 524 have a first pitch distance 604. ICs 510, 512 and 514 have lesser isolation requirements that are not as severe as those of IC 524. Because of this lesser isolation requirement, a second pitch distance 608 (less than the first pitch distance 602) between the package signal connections 606 that overlay ICs 510, 512, and 514 is used.

Figure 7:
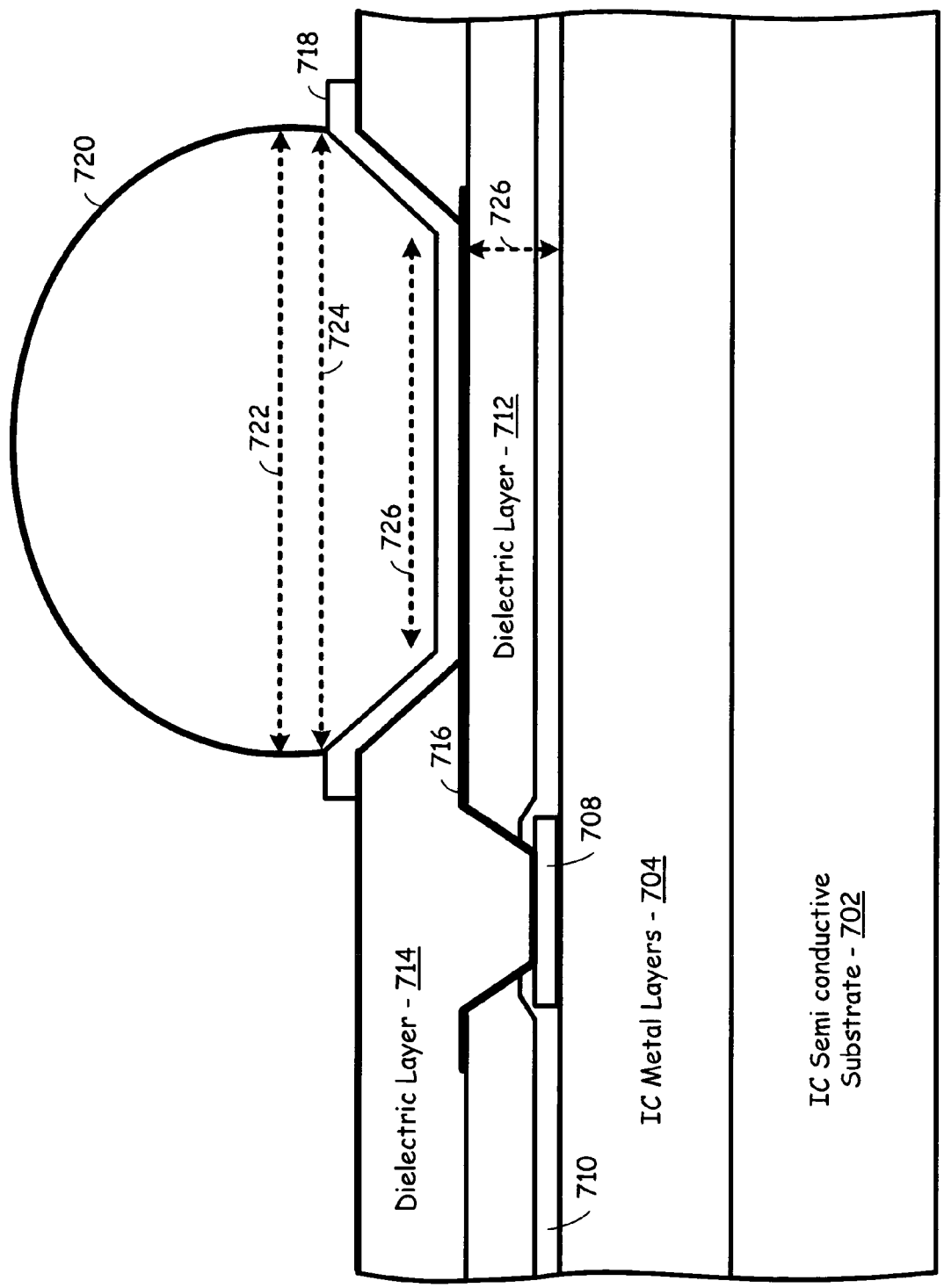
FIG. 7 is a diagrammatic sectional side view of a portion of an integrated circuit package constructed according to an embodiment of the present invention.

FIG. 7 is a diagrammatic sectional side view of a portion of an integrated circuit package constructed according to an embodiment of the present invention. An IC semiconductive substrate 702 has ICs formed there upon and therein. Residing upon the IC semiconductive substrate 702 are a plurality of IC metal layers 704 that provide communication connectivity between/among the circuits formed in the semiconductive substrate 702. This structure is conventional and generally known. Formed upon a top IC metal layer (of the IC metal layers 704) is a signal pad 708. The signal pad 708 communicatively couples to one or more conductors formed the IC metal layers 704. A dielectric layer 710 is formed above the IC metal layers 704 and the signal pad 708 to protect the IC metal layers 704. An opening is formed in the dielectric layer 710 to allow access to the signal pad 708.

The wafer-level flip chip package of FIG. 7 includes a first dielectric layer 712 formed upon the insulation layer 710 of semiconductive die. The wafer level flip chip package further includes a redistribution layer (RDL) conductor corresponding to the signal pad 708 that is formed upon the dielectric layer 712. Formed above the RDL 716 is a dielectric layer 714 that provides electrical isolation and protection for the UBM 716 and protection for underlying components. Under bump metallization (UBM) layer 718 is formed within an opening in the dielectric layer 714, electrically couples to RDL 716, and provides a location for bump/ball 720. Bump/ball 720 is formed upon the UBM layer 718, includes a base dimension 726, a pad size dimension 724, and a bump/ball diameter 722. The thickness of dielectric layers 712 and 714 is selected to satisfy particular isolation requirements of ICs formed in the IC semiconductive substrate 702 and IC metal layers 704. The thickness of dielectric layer 712 and dielectric layer 710 are represented by distance 726 in FIG. 7 and is selected according to the present invention to meet the isolation requirements of the ICs. According to one embodiment of the present invention, a combined thickness of dielectric layers 710, 712, and 714 has a minimum thickness. Using processing techniques available at the time of filing of this application, this thickness is at least ten (10) micrometers (μm). The IC package of FIG. 7 may include additional components as well such as a protective insulation layer adjacent IC semiconductive substrate 702.

Figure 8:
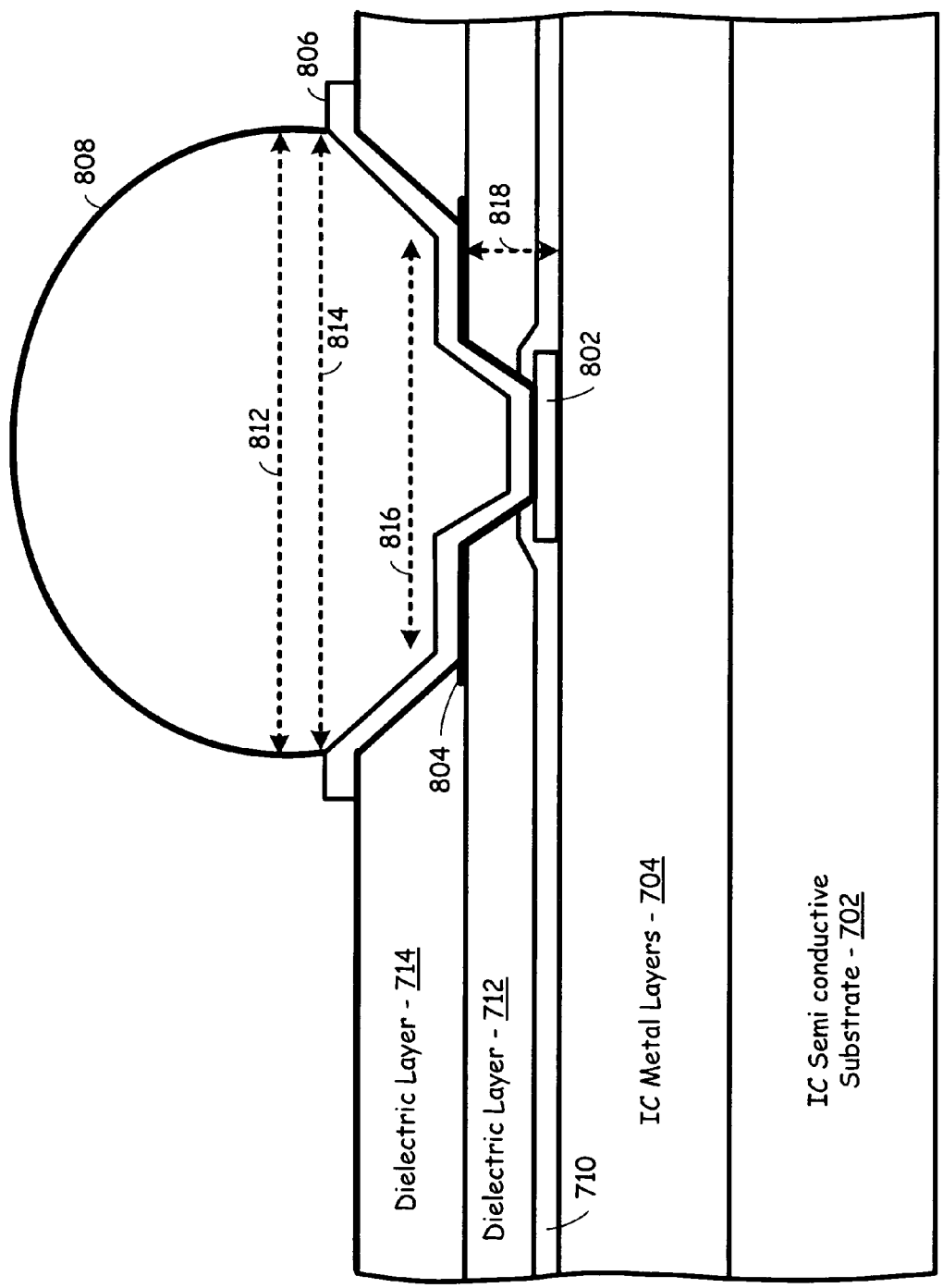
FIG. 8 is a diagrammatic sectional side view illustrating another portion of the integrated circuit package constructed according to an embodiment of the present invention.

FIG. 8 is a diagrammatic sectional side view illustrating another portion of the integrated circuit package constructed according to an embodiment of the present invention. As distinguished from the construct of FIG. 7, the construct of FIG. 8 includes a bump/ball 808 that resides substantially above signal pad 802. The combined thickness of dielectric layer 712 and dielectric layer 710 (distance 818) provides isolation between the RDL 804 and IC metal layers 704. The thickness of dielectric layer 714 provides further isolation between a surface of the packaged IC and metal layers 704. According to one embodiment of the present invention, a combined thickness of dielectric layers 710, 712, and 714 has a minimum thickness. Using processing techniques available at the time of filing of this application, this thickness is at least ten (10) micrometers (μm). As is shown, the bump/ball has a diameter 812, a diameter 806 at the top of UBM 806, and a diameter 816 at its base. The relative position of the package signal connections of the structures of FIG. 7 and FIG. 8 will be illustrated further with respect to FIG. 9.

Figure 9:
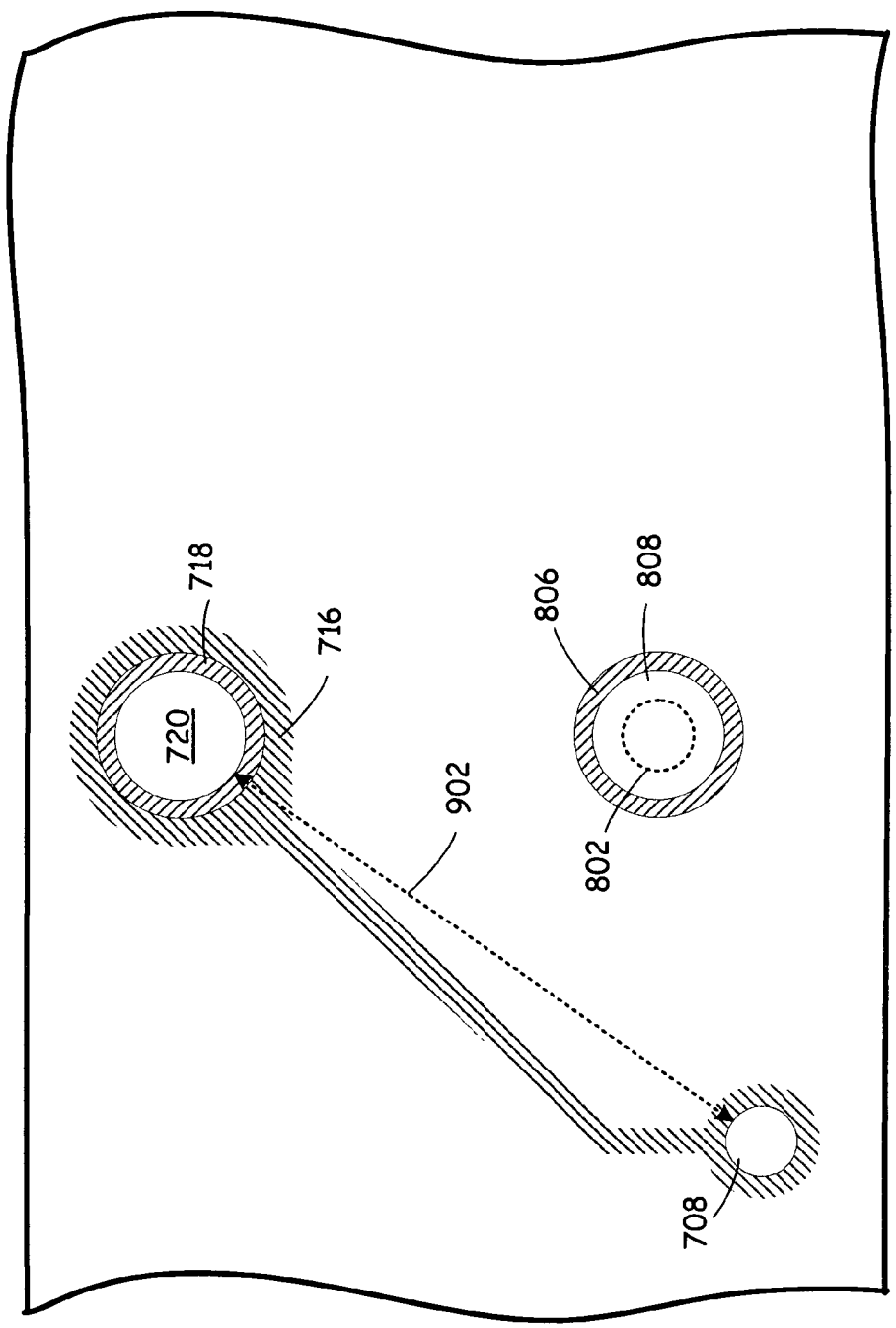
FIG. 9 is a diagrammatic top view of a portion of an integrated circuit package constructed according to an embodiment of the present invention.

FIG. 9 is a diagrammatic top view of a portion of an integrated circuit package constructed according to an embodiment of the present invention. As is shown, a distance between signal pad 708 and bump/ball 720 is represented as distance 902. Distance 902 may be selected based upon characteristics of ICs serviced by signal pad 708. Further, the relative positions of bump/ball 720 and bump/ball 808 may be selected to establish a desired pitch distance or a particular positioning of bump/ball 720 and 808 above underlying ICs.

Figure 10:
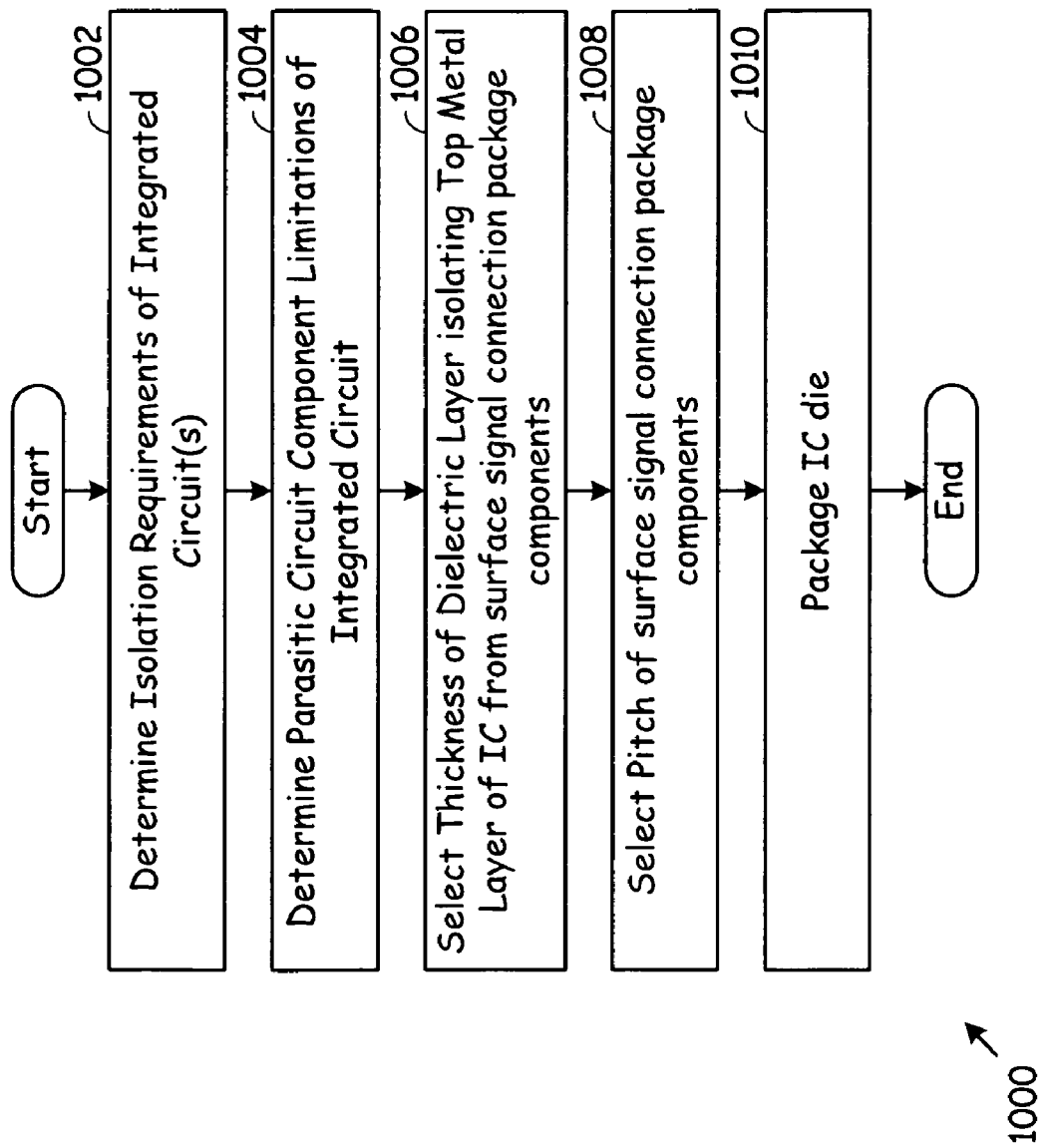
FIG. 10 is a flow chart illustrating a method for constructing a wafer-level chip scale flip chip package according to an embodiment of the present invention.

FIG. 10 is a flow chart illustrating a method for constructing a wafer-level chip scale flip chip package according to an embodiment of the present invention. Operation commences with determining the isolation requirements of an IC formed in a semi conductive die from package signal connections (and other components) of the wafer-level chip scale flip chip package (Step 1002). Operation may further include determining the parasitic circuit component limitations of the ICs formed on the semi conductive die (Step 1004). Then, based upon at least the isolation requirements of the IC, operation includes selecting a thickness of at least one dielectric layer that isolates a top metal layer of the IC from the package signal connections (and other components) of the wafer-level chip scale flip chip package (Step 1006). Operation may further include selecting a pitch of the package signal connections of the package (Step 1008). The pitch of the package signal connections of the package may be consistent across a surface of the package. Alternatively, the pitch of the package signal connections of the package may vary depending upon the characteristics of an underlying IC formed in the semi conductive substrate. Finally, with these limitations established, a package is formed (Step 1010).

FIG. 11 is a flow chart illustrating a method for constructing a wafer-level chip scale flip chip package according to another embodiment of the present invention. Operation commences in determining the isolation requirements of a plurality of ICs formed in a semi conductive die (Step 1102). Operation continues in determining the parasitic circuit component limitations of each of the plurality of ICs formed in the semi conductive die (Step 1104). Then, operation includes selecting a thickness of at least one dielectric layer that isolates a top metal layer of the IC die from package signal connections of the package (Step 1106). Operation then continues with selecting a pitch of the package signal connections of the package that will reside above each of the plurality of ICs (Step 1108). Because of the differing isolation requirements of the ICs formed on the semi conductive die, the pitch of the package signal connections may vary across a surface of the package. Alternatively, the pitch of the package signal connections of the package may be consistent across the coupling circuit of the package. Operation continues in selecting particular positions of package signal connections of the package based upon the positions of signal pads of the plurality of ICs formed in the semi conductive die (Step 1110). Operation concludes with packaging the IC die in the wafer-level chip scale flip chip package formed according to Steps 1102-1110 (Step 1112).

As one of average skill in the art will appreciate, the term "communicatively coupled," as may be used herein, includes wireless and wired, direct coupling and indirect coupling via another component, element, circuit, or module. As one of average skill in the art will also appreciate, inferred coupling (i.e., where one element is coupled to another element by inference) includes wireless and wired, direct and indirect coupling between two elements in the same manner as "communicatively coupled."

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A method for forming a wafer level chip scale flip chip package comprising:
  determining operational dielectric isolation requirements between a plurality of circuits of an integrated circuit formed in a semi conductive substrate and package signal connections of the wafer level chip scale flip chip package;
  based upon the operational dielectric isolation requirements of the integrated circuit, selecting a thickness of at least one dielectric layer isolating a top metal layer of the integrated circuit from the package signal connections of the wafer level chip scale flip chip package;

for each of the plurality of circuits of the integrated circuit formed in the semi conductive substrate, determining operational parasitic coupling limitations between the circuit of the integrated circuit and the package signal connections of the wafer level chip scale flip chip package; and based upon operational parasitic coupling limitations between the circuits of the integrated circuit and the package signal connections of the wafer level chip scale flip chip package, for each of the plurality of circuits of the integrated circuit, selecting minimum pitches of respective adjacently located package signal connections of the wafer chip scale flip chip package.

2. The method of claim 1, wherein a combined thickness of the at least one dielectric layer isolating a top metal layer of the integrated circuit from the package signal connections of the wafer level chip scale flip chip package is at least ten micrometers.

3. The method of claim 1, wherein:

a first circuit of the plurality of circuits of the integrated circuit corresponds to a first plurality of adjacently located package signal connections having a first pitch distance; and a second circuit of the plurality of circuits of the integrated circuit corresponds to a second plurality of adjacently located package signal connections having a second pitch distance that differs from the first pitch distance.

4. The method of claim 1, further comprising, for each of a plurality of signal pads of the integrated circuit:

determining a maximum lateral distance from the signal pad to a servicing package signal connection of the wafer level chip scale flip chip package; and locating the servicing package signal connection of the wafer level chip scale flip chip package based upon the maximum lateral distance.

5. The method of claim 1, further comprising, for at least one pair of signal pads of the integrated circuit:

determining a minimum lateral distance from the signal pad to a servicing package signal connection of the wafer level chip scale flip chip package; and locating the servicing package signal connection of the wafer level chip scale flip chip package based upon the minimum lateral distance.

6. The method of claim 1:

wherein selecting the thickness of the at least one dielectric layer isolating the top metal layer of the integrated circuit from the package signal connections of the wafer level chip scale flip chip package further considers the parasitic coupling limitations.

7. The method of claim 1, further comprising:

selecting package signal connection component sizes of the wafer level chip scale flip chip package based upon the parasitic coupling limitations.

8. A method for forming a wafer level chip scale flip chip package comprising:

determining operational dielectric isolation requirements between a plurality of integrated circuits formed in a semi conductive substrate and package signal connections of the wafer level chip scale flip chip package;

based upon the operational dielectric isolation requirements of the plurality of integrated circuits, selecting a thickness of at least one dielectric layer isolating a top metal layer of the integrated circuit from the package signal connections of the wafer level chip scale flip chip package;

for each of the plurality of integrated circuits, determining a minimum pitch of package signal connections of the wafer level chip scale flip chip package that will reside above the integrated circuit; and locating the package signal connections of the wafer level chip scale flip chip packages to satisfy the minimum pitch requirements for each of the plurality of integrated circuits.

9. The method of claim 8, wherein a combined thickness of the at least one dielectric layer isolating a top metal layer of the integrated circuit from the package signal connections of the wafer level chip scale flip chip package is at least ten micrometers.

10. The method of claim 8, wherein the minimum pitch of different groups of package signal connections of the wafer level chip scale flip chip package residing above differing integrated circuits of the plurality of integrated circuits differs.

11. The method of claim 8, further comprising, for each of a plurality of signal pads of the integrated circuit:

determining a maximum lateral distance from the signal pad to a servicing package signal connection of the wafer level chip scale flip chip package; and determining a position of the servicing package signal connection of the wafer level chip scale flip chip package based upon the maximum lateral distance.

12. The method of claim 8, further comprising, for at least one pair of signal pads of the integrated circuit:

determining a minimum lateral distance from the signal pad to a servicing package signal connection of the wafer level chip scale flip chip package; and determining a position of the servicing package signal connection of the wafer level chip scale flip chip package based upon the minimum lateral distance.

13. The method of claim 8:

further comprising determining operational parasitic coupling limitations between the plurality of integrated circuits formed in the semi conductive substrate and the package signal connections of the wafer level chip scale flip chip package; and wherein selecting the thickness of the at least one dielectric layer isolating the top metal layer of the integrated circuit from the package signal connections of the wafer level chip scale flip chip package further considers the operational parasitic coupling limitations.

14. The method of claim 8, further comprising:

determining operational parasitic coupling limitations between the plurality of integrated circuits formed in the semi conductive substrate and the package signal connections of the wafer level chip scale flip chip package; and selecting package signal connection component sizes of the wafer level chip scale flip chip package based upon the operational parasitic coupling limitations.

15. A method for forming a wafer level chip scale flip chip package comprising:

determining operational parasitic coupling limitations between an integrated circuit formed in a semi conductive substrate and package signal connection components of the wafer level chip scale flip chip package; and based upon the operational parasitic coupling limitations, selecting a thickness of at least one dielectric layer isolating a top metal layer of the integrated circuit from the package signal connections of the wafer level chip scale flip chip package; and selecting a minimum pitch of package signal connections of the wafer chip scale flip chip package.

16. The method of claim 15, wherein a combined thickness of the at least one dielectric layer isolating a top metal layer of the integrated circuit from the package signal connections of the wafer level chip scale flip chip package is at least ten micrometers.

17. The method of claim 15, further comprising, for each of a plurality of signal pads of the integrated circuit:

determining a maximum lateral distance from the signal pad to a servicing package signal connection of the wafer level chip scale flip chip package; and locating the servicing package signal connection of the wafer level chip scale flip chip package based upon the maximum lateral distance.

18. The method of claim 15, further comprising, for at least one pair of signal pads of the integrated circuit:

determining a minimum lateral distance from the signal pad to a servicing package signal connection of the wafer level chip scale flip chip package; and locating the servicing package signal connection of the wafer level chip scale flip chip package based upon the minimum lateral distance.

19. The method of claim 15, further comprising selecting package signal connection component sizes of the wafer level chip scale flip chip package based upon the operational parasitic coupling limitations.

20. A method for forming a wafer level chip scale flip chip package comprising:

determining operational dielectric isolation requirements between a plurality of integrated circuits formed in a semi conductive substrate and package signal connections of the wafer level chip scale flip chip package;

based upon the operational dielectric isolation requirements, for each of the plurality of integrated circuits, determining a minimum pitch requirement of package signal connections of the wafer level chip scale flip chip package that will reside above the integrated circuit; and locating the package signal connections of the wafer level chip scale flip chip packages to satisfy the minimum pitch requirements for each of the plurality of integrated circuits.

21. The method of claim 20, wherein the minimum pitch requirement of different groups of package signal connections of the wafer level chip scale flip chip package residing above differing integrated circuits of the plurality of integrated circuits differs.

22. The method of claim 20, further comprising, for each of a plurality of signal pads of the integrated circuit:

determining a maximum lateral distance from the signal pad to a servicing package signal connection of the wafer level chip scale flip chip package; and determining a position of the servicing package signal connection of the wafer level chip scale flip chip package based upon the maximum lateral distance.

23. The method of claim 20, further comprising, for at least one pair of signal pads of the integrated circuit:

determining a minimum lateral distance from the signal pad to a servicing package signal connection of the wafer level chip scale flip chip package; and determining a position of the servicing package signal connection of the wafer level chip scale flip chip package based upon the minimum lateral distance.

24. The method of claim 20:

further comprising determining operational parasitic limitations between the plurality of integrated circuits formed in the semi conductive substrate and the package signal connections of the wafer level scale flip chip package; and wherein locating the package signal connections of the wafer level chip scale flip chip packages further considers the operational parasitic limitations.

25. The method of claim 20, further comprising: determining operational parasitic limitations between the plurality of integrated circuits formed in the semi conductive substrate and the package signal connections of the wafer level scale flip chip package; and selecting package signal connection component sizes of the wafer level chip scale flip chip package based upon the operational parasitic limitations.

* * * * *